(12) United States Patent
Xu

(10) Patent No.: US 6,182,017 B1
(45) Date of Patent: Jan. 30, 2001

(54) METHOD AND APPARATUS FOR DIFFERENTIATING CONTRIBUTIONS OF HARMONIC POLLUTION SOURCES

(75) Inventor: Wilsun Xu, Edmonton (CA)

(73) Assignee: The Governor of the University of Alberta, Edmonton (CA)

( * ) Notice: Under 35 U.S.C. 154(b), the term of this patent shall be extended for 0 days.

(21) Appl. No.: 09/132,364

(22) Filed: Aug. 11, 1998

(51) Int. Cl.$^7$ .......................... G01R 23/165; G01R 21/06
(52) U.S. Cl. ........................ 702/60; 324/623; 307/105
(58) Field of Search ........................ 702/60, 75, 77, 702/64, 65, 62, 57–59, 69; 324/623, 525, 622, 76.19, 76.77, 254, 142; 307/105; 363/39

(56) References Cited

U.S. PATENT DOCUMENTS

| | | | |
|---|---|---|---|
| 4,667,152 | * 5/1987 | Hayes et al. | 324/76.24 |
| 4,695,792 | * 9/1987 | Roy | 324/76.82 |
| 5,212,441 | 5/1993 | McEachern et al. | 324/142 |
| 5,298,854 | 3/1994 | McEachern et al. | 324/142 |
| 5,298,855 | 3/1994 | McEachern et al. | 324/142 |
| 5,298,856 | 3/1994 | McEachern et al. | 324/142 |
| 5,298,859 | 3/1994 | McEachern et al. | 324/142 |
| 5,302,890 | 4/1994 | McEachern et al. | 324/142 |
| 5,307,009 | 4/1994 | McEachern et al. | 324/142 |
| 5,508,623 | * 4/1996 | Heydt et al. | 324/623 |
| 5,731,965 | * 3/1998 | Cheng et al. | 363/41 |

\* cited by examiner

Primary Examiner—Marc S. Hoff
Assistant Examiner—Hien Vo
(74) Attorney, Agent, or Firm—Lumen Intellectual Property Services

(57) ABSTRACT

A method of determining parameters of a harmonic pollution source connected to a power line at a connection point. The harmonic pollution source is a power customer and the power is supplied by an electric utility. The electric utility is also a source of harmonic pollution. Both the utility and customer can be modeled as a harmonic current source in parallel with an impedance. In the method of the present invention, a harmonic voltage and a harmonic current are measured at the connection point between the utility and customer. The voltage and current measurements are combined with the known reference impedances in a calculation to yield the magnitude of current produced by the customer or utility harmonic current sources. Also, the present invention provides a method for determining the relative harmonic pollution contributions from the utility and customer. Both the utility and customer can then know exactly how much harmonic pollution they are emitting into the power line to which they are connected. The pollution contribution calculation requires knowledge of both utility and customer reference impedances and the harmonic voltage and harmonic current measurements. The present invention includes a method of determining a pollution contribution from the customer where the pollution contribution measurement is not influenced by changes in utility impedance.

14 Claims, 6 Drawing Sheets

METHOD AND APPARATUS FOR DIFFERENTIATING CONTRIBUTIONS OF HARMONIC POLLUTION SOURCES

RELATED APPLICATIONS

This application is related to patent application "Method and Apparatus for Measuring Harmonic Current Sources in Electric Power Distribution Systems" by Wilsun Xu, filed concurrently with the present application.

FIELD OF THE INVENTION

This invention relates generally to methods for measuring harmonic pollution sources in electrical power distribution systems. More particularly, it relates to a method and apparatus for measuring the harmonic pollution generated in localized regions of a power distribution system.

BACKGROUND OF THE INVENTION

Alternating current networks and devices are typically designed to operate on sinusoidal 50 Hz or 60 Hz alternating voltages and currents. The voltage and current waveforms in modern power distribution systems are seldom sinusoidal, however, because of the increased use of nonlinear electrical loads such as variable speed motor drives. Such nonlinear loads draw a nonsinusoidal current from a sinusoidal voltage source. This results in a waveform distortion which propagates outward from the nonlinear electrical load into the rest of the network. The distorted waveform typically includes frequency components which are multiples of the original frequency of the electrical power (50 Hz or 60 Hz). These high frequency components are called harmonics. The harmonics are created by the nonlinear electrical load. In 60 Hz power distribution systems, harmonics at 300HZ, 420 Hz, 660 Hz and other odd-multiples of frequency are particularly significant. It is desirable to limit the production and propagation of harmonics because harmonics can disrupt and damage sensitive electrical devices drawing power from the power distribution system.

One problem with limiting the production of harmonics is that they are difficult to trace. Their source cannot easily be found and measured. Nearly all electric customers create harmonic pollution which is spread by the distribution system to other customers. Other customers may experience problems due to the harmonics, but the source of the offending harmonics is difficult to identify. If harmonic current sources could be located and accurately measured, harmonic pollution could be more effectively eliminated from power distribution systems.

Two methods have been proposed for the purpose of limiting the amount of harmonic pollution present in a power distribution system. One method involves the establishment of limits on the amount of harmonic energy generated by customers and utilities. Power distribution systems are designed to operate within these limits. This scheme has been widely adopted in the power industry at present. Reference can be made to The IEEE Standard 519, "IEEE Recommended Practice for Harmonic Control" concerning the limits on harmonic energy generation. A major problem with this scheme is that if the limits are exceeded by a customer, the only enforcement power the utility has is to disconnect the customer, which is not desirable. As a result, an incentive method has recently been proposed in which harmonic generators are charged an amount commensurate with their harmonic pollution level when the limits are exceeded. Various methods have been proposed to measure the harmonic pollution generated by customers in order to implement the incentive method. Reference can be made to U.S. Pat Nos. 5,307,009, 5,302,890, 5,298,859, 5,298,856, 5,298,855, 5,298,854, and 5,212,441 concerning methods of measuring harmonic pollution levels and defining an incentive rate pricing structure. The methods described in these patents, however, generally do not differentiate sources of harmonic pollution connected to the same power lines. Also, these methods do not compensate for circuit changes which may affect other pollution sources. For example, an impedance change in one pollution source will affect the amount of harmonic pollution emitted by other pollution sources. Therefore, a change in one pollution source may be mistakenly attributed to other pollution sources.

The successful implementation of a rational and equitable incentive method for limiting harmonic pollution requires the accurate and quantitative measurement of individual harmonic pollution sources connected to a common power line. Harmonic pollution contributions from a power utility and power customer must be distinguished. Also, the impact of impedance changes on the limit violation must be quantified and compensated for. For example, changes in the impedance of the utility can result in changes in the amount of harmonic energy emitted by a customer. In such cases, the customer should not be held responsible for the resulting changes in harmonic pollution emitted because the customer has no control over the harmonic impedance of the utility. These problems are not solved by known techniques which essentially assume that the electric utility does not produce harmonic pollution, i.e. that the customer is entirely responsible for all the harmonic pollution at the connection point between the utility and customer.

There are many commercially available instruments for measuring parameters of harmonic disturbances such as the magnitudes of the harmonic currents and voltages. Some such instruments measure the direction of harmonic energy flow, thereby enabling the harmonic pollution source to be located. If the energy flows from the left to the right of the metering point, the harmonic power source is on the left, and vice versa. U.S. Pat Nos. 4,667,152 to Hayes et al., and 5,508,623 to Heydt et al. operate according to this principle. The harmonic energy-flow technique, however, has the following major shortcomings:

1) It only detects the net direction of harmonic energy flow. The method cannot determine if there are harmonic current sources on both sides of the metering point.

2) The method is qualitative. It is unable to measure the relative contributions of different harmonic current sources if the sources are located on opposite sides of the metering point.

3) The method detects direction based on net harmonic power. Intervening impedances can thus result in misleading information about the locations of the harmonic current sources. For example, it is possible for a right side harmonic current source to produce more harmonic energy than a left side harmonic current source, but for the net harmonic energy flow to be from left to right.

What is needed is a technique for measuring parameters of a single harmonic pollution source, where the measurement is not affected by other harmonic pollution sources or impedances connected to the same power distribution system. The techniques should be able to compensate for impedance changes or harmonic energy changes external to the harmonic pollution source of interest. More specifically, the method should be able to individually measure the electric utility contribution and customer contribution to the total harmonic pollution present in the power distribution system.

OBJECTS AND ADVANTAGES OF THE INVENTION

Accordingly, it is a primary object of the present invention to provide a method for measuring parameters of a harmonic pollution source of interest in a power distribution system that:

1) can individually measure an electric utility contribution and a customer contribution to the total harmonic pollution present in a power distribution system;

2) can compensate for changes in impedance to yield consistent measurements of the harmonic pollution source of interest;

3) can measure the most fundamental parameters of a harmonic pollution source, so that the measurement is not affected by changes external to the harmonic pollution source.

These and other objects and advantages will be apparent upon reading the following description and accompanying drawings.

SUMMARY OF THE INVENTION

These objects and advantages are provided by a method for determining a harmonic current contribution from a harmonic pollution source of interest connected to a remaining portion of a power distribution system at a connection point. In the method, a total harmonic voltage is measured at the connection point. Also, simultaneous with the total harmonic voltage measurement, a total harmonic current flowing through the connection point is measured. The measurements of total harmonic current and total harmonic voltage allow one to calculate the harmonic current contribution. Reference values of an impedance of the remaining portion and harmonic pollution source must be known. In this first embodiment, the harmonic pollution source and remaining portion are modeled to have a harmonic current source in parallel with an impedance.

An in-phase component of the harmonic current contribution which is in-phase with the total harmonic current measurement can also be determined.

Also, the method of the present invention can be used in cases where an electrical characteristic of the harmonic pollution source or remaining portion has changed. Changes in impedances, and changes in the harmonic current sources are examples of changes in electrical characteristics. Changes in electrical characteristics will not unfairly change the pollution contribution attributed to the harmonic pollution source of interest.

The method of the present invention includes the possibility of modeling the remaining portion and harmonic pollution source as having a harmonic voltage source in series with an impedance. In this case, a harmonic voltage contribution is determined. A total harmonic voltage is measured at the connection point, and a total harmonic current is measured flowing through the connection point. The measurements of total harmonic current and total harmonic voltage allow one to calculate the harmonic voltage contribution according to an equation disclosed herein. Reference values of the impedance of the remaining portion and harmonic pollution source must be known.

An in-phase component of the harmonic voltage contribution which is in-phase with the total harmonic voltage measurement can also be determined.

Also, the voltage-source method of the present invention can be used in cases where an electrical characteristic of the harmonic pollution source or remaining portion has changed. Changes in impedances, and changes in the harmonic voltage sources are examples of changes in electrical characteristics. Changes in electrical characteristics will not unfairly change the pollution contribution attributed to the harmonic pollution source of interest.

The present invention includes an apparatus for performing the method of the present invention. The apparatus includes a harmonic voltage meter and a harmonic current meter for measuring harmonic voltages and currents at the connection point. The apparatus also includes a data storage device for storing reference values of impedance and a computer for performing calculations.

The present invention also includes a method for converting a change in impedance into an equivalent change in current in a harmonic current source.

DETAILED DESCRIPTION

Figure 1:
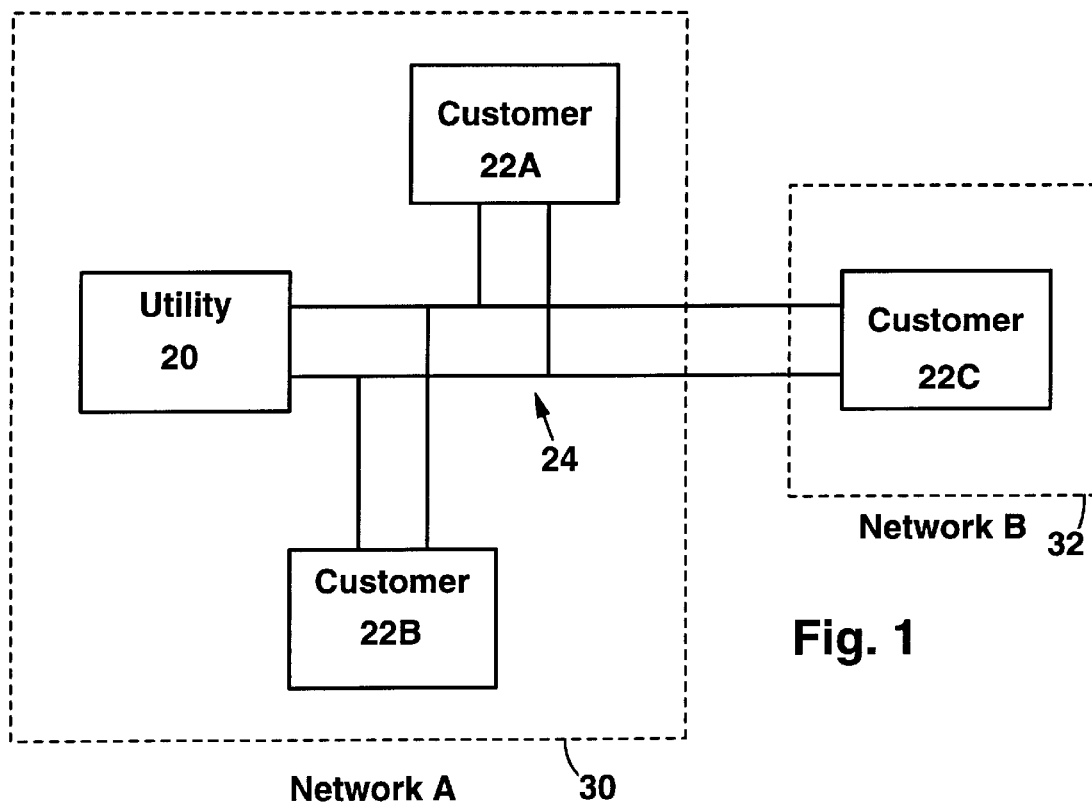
FIG. 1 shows a power distribution system in which the method of the present invention can be used.

FIG. 1 shows a model of a power distribution system. An electric power utility 20 is connected to customers 22A, 22B, 22C by power lines 24. The utility 20 and each of the customers are harmonic pollution sources, generating harmonic pollution which is distributed throughout the system by the power lines 24. The amount of harmonic pollution present in the power lines 24 is dependent upon the magnitude of the harmonic current generated by the pollution sources 20, 22A, 22B, 22C as well as by an impedance associated with each of the sources. It is desired to be able to measure the harmonic pollution characteristics of a particular source (e.g. 22C) independent from the other sources 20, 22A, 22B.

The power distribution system of FIG. 1 can be conceptually divided into a network A 30 and a network B 32. Network B comprises a single customer 22C and network A comprises all the other sources connected to the power lines 24. The specification of a harmonic pollution source of interest determines the manner in which the system is divided into networks A and B. In the present example, the harmonic pollution source of interest is customer 22C, or equivalently, network B 32. It is obvious that, alternatively, any of the other harmonic pollution sources 20, 22A, or 22C could also be defined as the harmonic pollution source of interest.

Most generally, the power distribution system of FIG. 1 comprises the harmonic pollution source of interest (network B 32, or customer 22C), and a remaining portion of the power distribution system (network A 30). The remaining portion of the power distribution system includes all the harmonic pollution sources in the power distribution system external to the harmonic pollution source of interest 22C.

Figure 2:
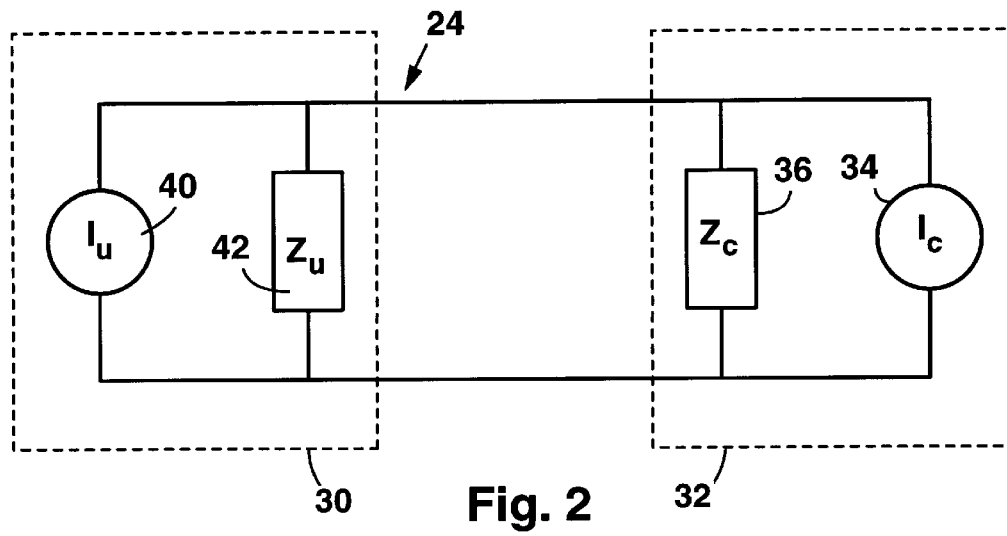
FIG. 2 shows a circuit model of the power distribution system of FIG. 1.

A simplified electrical schematic of network A and network B is shown in FIG. 2. Network B comprises a customer harmonic current source 34 in parallel with a customer impedance 36. The customer harmonic current source 34 produces a complex current represented by $I_u$. The customer impedance 36 has a complex impedance represented by $Z_u$. Network A comprises a utility harmonic current source 40 in parallel with a utility impedance 42. The utility harmonic current source 40 produces a complex current represented by $I_u$. The utility impedance 42 has a complex impedance represented by $Z_u$. In the present example, the utility impedance 42 and utility harmonic current source 40 represent the impedance and harmonic current source of the entire network A 30 (i.e. the remaining portion). It is noted that the harmonic current sources 34, 40 and impedances 36, 42 need only be defined at harmonic frequencies of interest (e.g. 300 Hz, 420 Hz).

Figure 3:
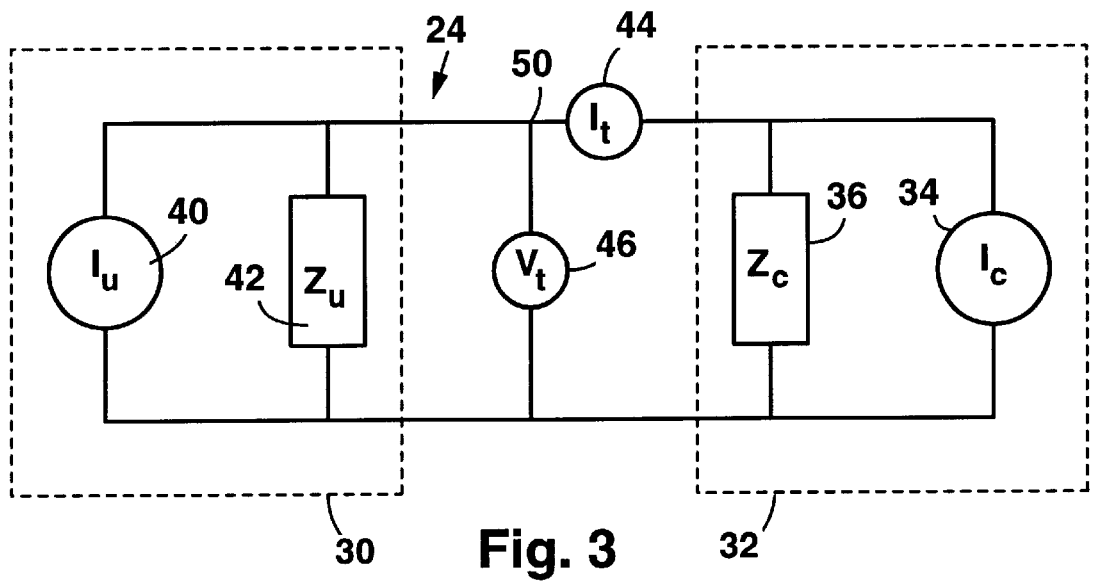
FIG. 3 shows the circuit model with measurement devices capable of supplying measurements used in the method of the present invention.

FIG. 3 shows the model of FIG. 2 with measuring devices capable of performing the method of the present invention. A harmonic current meter 44 measures a total harmonic current, $I_t$, flowing between network A 30 and network B 32 (i.e. through a connection point 50). A harmonic voltmeter 46 measures a total harmonic voltage, $V_t$, between the power lines 24 (or, alternatively, between a single power line and ground) at the connection point 50 between network A 30 and network B 32. The relative positions of the current meter 44 and voltage meter 46 are immaterial provided they are both located between network A and network B. It is understood that the location of the connection point 50 determines what parts of the power distribution system are in network A and what parts are in network B, but that the location is otherwise arbitrary. Typically, the connection point is selected to be located at an electric power metering point for the customer 22C.

A first embodiment of the present invention applies when $Z_u$ and $Z_c$ are constant in time and are known. In this case, changes in the total harmonic current It is affected only by changes in $I_c$ and $I_u$. It is a common practice that an electrical utility provide $Z_u$ information to new customers and when substantial changes are made to the power distribution system. Also, it is a common practice to measure $Z_c$ for a new customer. The original values of $Z_u$ and $Z_c$ are reference impedance values and are used in the present invention to determine subsequent changes in harmonic pollution sources. The reference impedance data is used for harmonic filter design and for harmonic limit compliance verification. Alternatively, $Z_u$ and $Z_c$ can be measured using the apparatus and method disclosed in copending patent application "Method and Apparatus for Measuring Harmonic Current Sources in Electric Power Distribution Systems" by Wilsun Xu, filed concurrently with the present application.

In performing the method of the present invention, the harmonic current meter 44 and the harmonic voltage meter 46 simultaneously record measurements of $I_t$ and $V_t$. The longer the measurement time, the more accurate the final results. For many applications, a measurement time of about 2 seconds is sufficient for accurate results. $I_c$ and $I_u$ can then be found from the following equations:

$$I_u = \frac{V_t}{Z_u} + I_t \quad \text{(equation 1)}$$

$$I_c = \frac{V_t}{Z_c} - I_t \quad \text{(equation 2)}$$

Where $I_t$ is defined as traveling in the same direction as $I_u$ (of course, $I_t$ may arbitrarily be defined to travel in the same or opposite direction from $I_c$ and $I_u$). This calculation is discretely performed for each harmonic frequency of interest.

Figure 4:
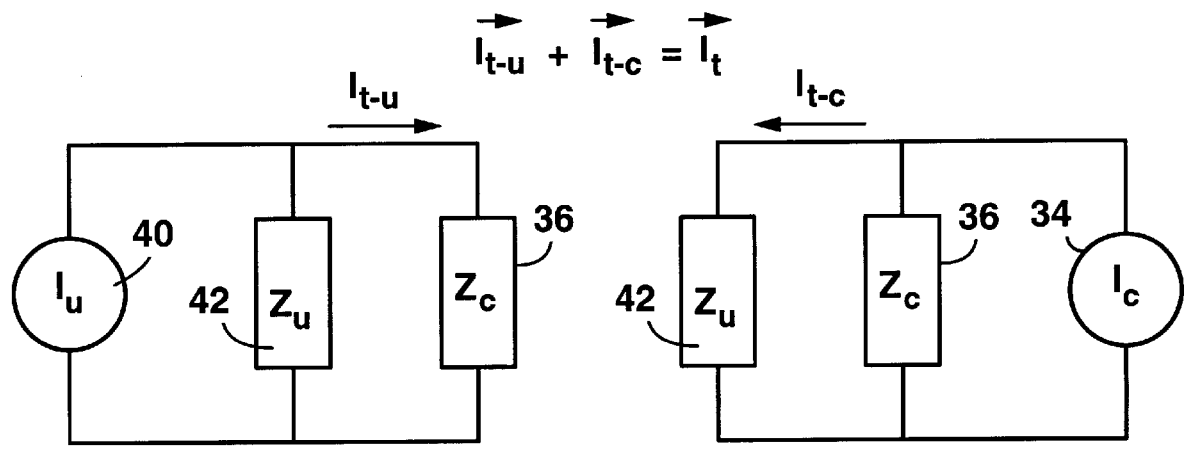
FIG. 4 shows how individual harmonic pollution contributions can be calculated.
Figure 5:
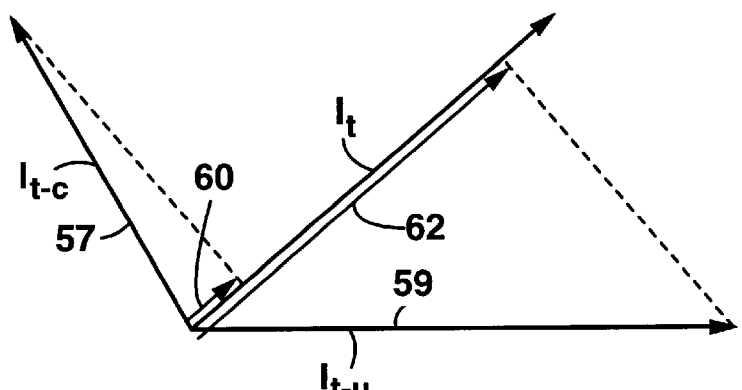
FIG. 5 shows a phasor diagram illustrating how the harmonic pollution contributions are combined to yield a total harmonic current.

$I_u$ and $I_c$ each make a contribution to $I_t$. FIG. 4 shows a schematic illustrating how the network A 30 and network B 32 are separated in order to distinguish the contributions. The contribution from $I_u$ to $I_t$ is denoted by $I_{t-u}$ and the contribution from $I_c$ to $I_t$ is denoted by $I_{t-c}$. Because $I_{t-u}$ and $I_{t-c}$ are complex-valued, they may be represented by vectors as indicated in FIG. 5. Vector addition of $I_{t-u}$ and $I_{t-c}$ yields $I_t$.

The relative magnitudes of $I_{t-u}$ and $I_{t-c}$ are determined by the impedances $Z_c$ and $Z_u$ in addition to the magnitudes and relative phase of $I_c$ and $I_u$. $I_{t-u}$ and $I_{t-c}$ can be calculated from the following equations:

$$I_{t-u} = \frac{Z_u}{Z_u + Z_c} I_u \quad \text{(equation 3)}$$

$$I_{t-c} = \frac{Z_c}{Z_u + Z_c} I_c \quad \text{(equation 4)}$$

It is noted that equations 1 & 3, and 2 & 4 can be combined to provide equations which allow the calculation of the harmonic pollution contributions ($I_{t-u}$ and $I_{t-c}$) directly from the measurements. These combined equations are as follows:

$$I_{t-u} = \frac{Z_u}{Z_u + Z_c} \left( \frac{V_t}{Z_u} + I_t \right) \quad \text{(equation 5)}$$

$$I_{t-c} = \frac{Z_c}{Z_u + Z_c} \left( \frac{V_t}{Z_c} - I_t \right) \quad \text{(equation 6)}$$

FIG. 5 shows a phasor diagram illustrating how $I_{t-u}$ 59 and $I_{t-c}$ 57 produce $I_t$. $I_{t-c}$ 57 and $I_{t-u}$ 59 are vectors which, when combined vectorally, produce $I_t$. $I_{t-u}$ and $I_{t-c}$ may add or subtract when combined, depending on the phase relationship between the vectors 57, 59. In FIG. 5, $I_{t-c}$ and $I_{t-u}$ each have a component which is in phase with $I_t$. An in-phase component 60 of $I_{t-c}$ which is in phase with $I_t$ is denoted by $I_{c-in}$. An in-phase component 62 of $I_{t-u}$ which is in phase with $I_t$ is denoted by $I_{u-in}$. $I_{c-in}$ and $I_{u-in}$ produce $I_t$ when added algebraically.

$I_{t-c}$ and $I_{c-in}$ are important because they provide measures of how much harmonic pollution the customer 22C is responsible for. $I_{t-c}$ is a measure of how much harmonic pollution the customer emits into the power line 24. $I_{c-in}$ is a measure of how much of $I_{t-c}$ ultimately contributes to $I_t$. Either $I_{t-c}$ or $I_{c-in}$ can be used as a basis for determining harmonic pollution fines imposed upon the customer 22C. $I_{c-in}$ and $I_{u-in}$ can be used to calculate what percentage of $I_t$ is due to the utility 20 and what percentage of $I_t$ is due to the customer 22C. $I_{c-in}$ and $I_{u-in}$ can be determined from $I_{t-c}$ and $I_{t-u}$ using well known vector calculational techniques.

In this way, the individual harmonic pollution contributions ($I_{t-u}$ and $I_{t-c}$) and the individual in-phase components ($I_{u-in}$ and $I_{c-in}$) from the utility and customer are independently measured.

It can be seen from equations 5 and 6 that a change in $Z_u$, the utility impedance, will change the amount of harmonic pollution that is emitted into the power lines 24 by the customer 22C. In other words, $Z_u$ affects $I_{t-c}$ as well as $I_{c-in}$. This is not desirable as the amount of harmonic pollution which the customer 22C is responsible for should not depend upon the impedance $Z_u$, which is outside the control of the customer 22C.

A second case considered in the present invention applies when $Z_u$ or $I_u$ changes. This can occur, for example, when harmonic pollution filters are added or removed or electrical equipment is connected or disconnected. Assume that $Z_u$ was originally measured to have a reference value of $Z_u$ and then changed to a new, different value of $Z_u^*$. New values of $I_t$ and $V_t$ are measured with the new, unknown impedance value $Z_u^*$, and are denoted by $I_t^*$ and $V_t^*$. $I_t^*$, $V_t^*$ and $Z_u$ are used to calculate a new, fictitious value for $I_u$, denoted by $I_u^*$:

$$I_u^* = \frac{V_t^*}{Z_u} + I_t^* \qquad \text{(equation 7)}$$

$I_u^*$ is the fictitious utility harmonic current that would produce the same harmonic pollution (when combined with $Z_u$) as the combination of $I_u$ and $Z_u$. The foregoing calculation therefore effectively converts a change in impedance ($Z_u$ to $Z_u^*$) into an equivalent change in harmonic current ($I_u$ to $I_u^*$). For the above calculation to be completed, the original reference impedance $Z_u$ must be known. This is feasible because the reference value of $Z_u$ is established when an electric power distribution system is established. The same $Z_u$ reference value can be used for many years as a reference impedance value for determining $I_u^*$.

Figure 6A:
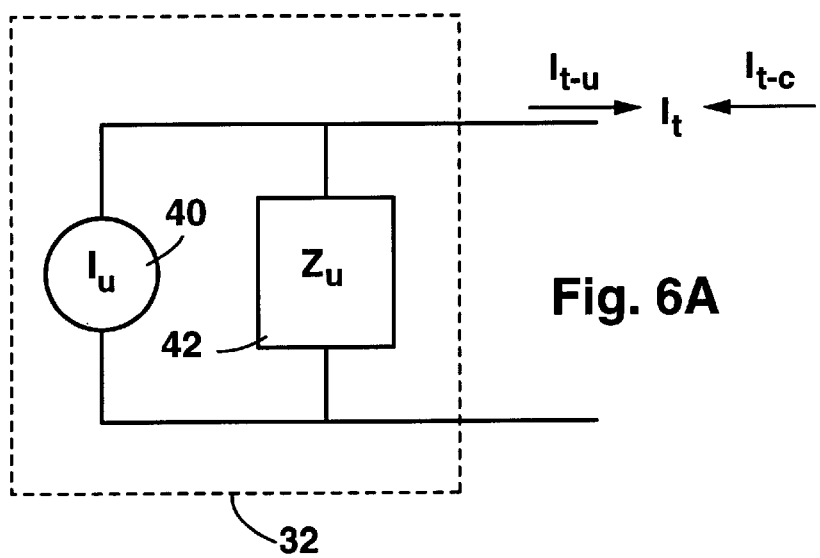
FIGS. 6A–6C show how a fictitious current is determined from voltage and current measurements.
Figure 6B:
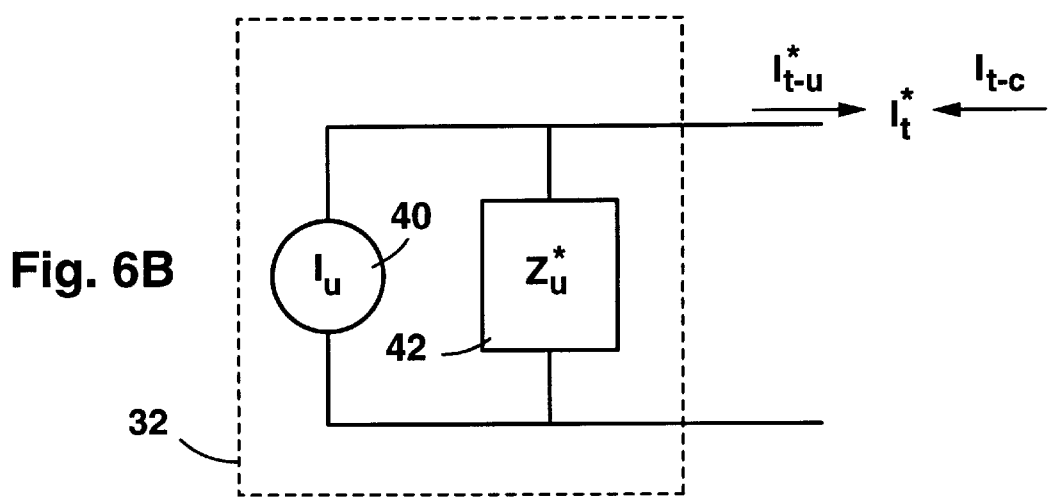
Figure 6C:
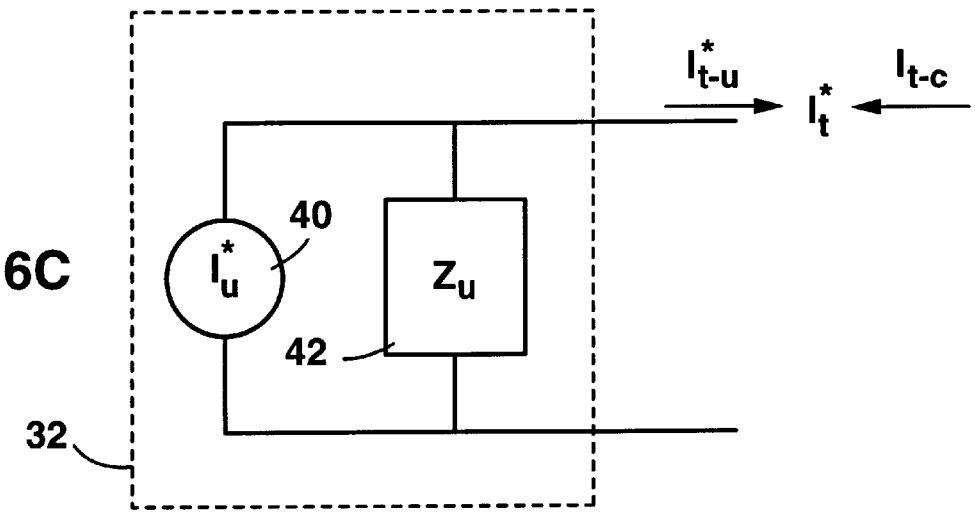

FIGS. 6A–6C further illustrate the calculation of $I_u^*$. FIG. 6A shows network B 32 with the reference value of $Z_u$, contributing a current of $I_{t-c}$. In FIG. 6B, the impedance has changed to $Z_u^*$, resulting in $I_t$ changing to $I_t^*$ (assuming network B 32, which is not shown, does not change). In FIG. 6C, the above calculation has been performed to determine $I_u^*$, the harmonic current which changes $I_t$ to $I_t^*$ when combined with the reference impedance value $Z_u$. $I_u^*$ is a fictitious current and is not actually produced by the harmonic current source 40. $I_u^*$ is simply a useful measure of network A 30. It is understood that the same method can be applied to the network B to yield a fictitious current $I_c^*$ in the case where $Z_c$ changes.

Also, changes in $I_u$ are included in $I_u^*$ when equation 7 is used. It is noted that changes in $Z_u$ or changes in $I_u$ are considered to be specific examples of changes in electrical characteristics. The method of the present invention can determine harmonic current contributions after changes in electrical characteristics, whether they are changes in impedance (e.g. $Z_u$) or harmonic current (e.g. $I_u$) produced by a harmonic current source.

Once $I_u^*$ is known, the entire power distribution system (network A and network B) can be reanalyzed using the method described above for the case where $Z_u$ and $Z_c$ are constant. Since the change from $Z_u$ to $Z_u^*$ was converted into the fictitious current $I_u^*$, $Z_u$ can now be considered to be constant. When the impedance changed from $Z_u$ to $Z_u^*$, the utility contribution $I_{t-u}$ changed to $I_{t-u}^*$. The new contribution $I_{t-u}^*$ is determined from the equation:

$$I_{t-u}^* = \frac{Z_u}{Z_u + Z_c} I_u^*. \qquad \text{(equation 8)}$$

$I_{t-u}^*$ is also obtainable directly from the measured and known quantities:

$$I_{t-u}^* = \frac{Z_u}{Z_u + Z_r} \left( \frac{V_t^*}{Z_u} + I_t^* \right) \qquad \text{(equation 9)}$$

A new customer contribution $I_{t-c}^*$ is also changed by the change of $V_t$ and $I_t$ to $V_t^*$ and $I_t^*$:

$$I_{t-c}^* = \frac{Z_c}{Z_u + Z_c} \left( \frac{V_t^*}{Z_c} - I_t^* \right) \qquad \text{(equation 10)}$$

However, $I_{t-c}^*$ (equation 10) is always less than $I_{t-c}$ (equation 6) when only the utility impedance changes. Therefore, the customer is prevented from being held responsible for changes in harmonic pollution which are due to changes in impedance external to the customer 22C. The objective of maintaining the same harmonic pollution penalty for the customer 22C independent of the utility impedance change is achieved. The present invention therefore provides a way of assuring that the customer 22C is held responsible only for changes within the customer's control.

Although the utility impedance change ($Z_u$ to $Z_u^*$) in reality affects the amount of harmonic energy released by the customer 22C, this is not the responsibility of the customer since the customer has no control over the utility impedance $Z_u$. The above calculation assures that any change in the harmonic pollution which occurs when the utility impedance changes will be the responsibility of the utility 20 (even if the source of additional pollution is the customer 22C). The desired goal of 'insulating' the customer from external changes in impedance has been achieved. Each harmonic pollution source 20, 22A, 22B, 22C can be individually measured without the measurement being affected by changes in impedance external to the source being measured. Of course, this requires that reference impedances (whose values are constant) be defined for each harmonic pollution source.

In a third case within the scope of the present invention, the customer impedance $Z_c$ changes to $Z_c^*$. In this case, the change in impedance is converted into a change in the customer harmonic current ($I_c$ to a fictitious current $I_c^*$). New values of $I_t$ and $V_t$ are measured with the new, unknown impedance value $Z_c^*$, and are denoted by $I_t^*$ and $V_t^*$. $I_t^*$, $V_t^*$ and $Z_c$ are used to calculate a new, fictitious value for $I_c$, denoted by $I_c^*$:

$$I_c^* = \frac{V^*}{Z_c} - I_t^* \qquad \text{(equation 11)}$$

$I_c^*$ is the fictitious customer harmonic current which would produce the same harmonic pollution (when combined with $Z_c$) as the combination of $I_c$ and $Z_c^*$. Of course, for the above calculation to be useful, the original impedance $Z_c$ must be known. This is feasible because a reference value of $Z_c$ is established when an electric customer is connected to a power distribution system. This same reference value of $Z_c$ can be used for many years as a reference point for determining $I_c^*$. Also, changes in $I_c$ are included in $I_c^*$ when equation 11 is used.

It is noted that changes in $Z_c$ or changes in $I_c$ are considered to be specific examples of changes in electrical characteristics. The method of the present invention can determine harmonic current contributions after changes in electrical characteristics, whether they are changes in impedance (e.g. $Z_c$) or harmonic current (e.g. $I_c$) produced by a harmonic current source. Also, the changes in electrical characteristics can occur internally or externally to the harmonic pollution source of interest.

A new customer contribution $I_{t-c}^*$ is calculated in a manner analogous to the above calculation:

$$I_{t-c}^* = \frac{Z_c}{Z_u + Z_c} I_c^* \qquad \text{(equation 12)}$$

$I_{t-c}^*$ is also obtainable directly from the known and measured quantities:

$$I_{t-c}^* = \frac{Z_c}{Z_u + Z_c}\left(\frac{V_t^*}{Z_c} - I_t^*\right) \qquad \text{(equation 13)}$$

$I_{t-c}^*$ provides a measure of how much harmonic pollution the customer 22C is responsible for. $I_{t-c}^*$ may be used as a basis for determining harmonic pollution penalties imposed upon the customer 22C. $I_{t-c}^*$ can also be used to determine $I_{c-in}^*$ which also may be used to determine harmonic pollution penalties.

From comparing equations 10 and 13 (which are identical), it can be seen that it is not necessary to determine which impedance ($Z_u$ or $Z_c$) has changed. The calculation embodied in equations 10 and 13 encompasses all possibilities. For example, it is also possible for $I_u$ or $I_c$ to change.

It is noted that if the impedances $Z_c$ and $Z_u$ do not change, then equations 7, 11, 8, and 12 are equivalent to equations 1, 2, 3, and 4, respectively. Therefore, equations 7, 11, 8, and 12 are considered to be the most general equations.

Figure 7:
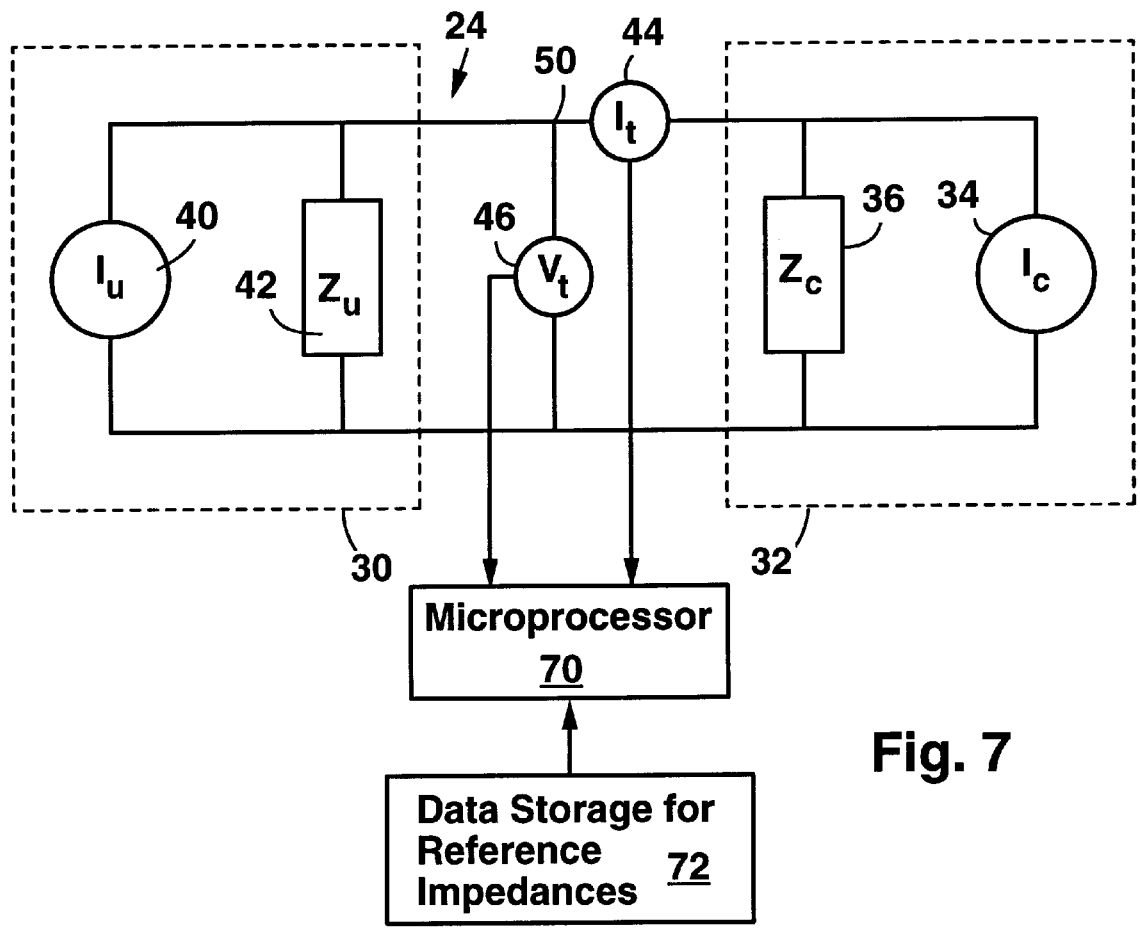
FIG. 7 shows an apparatus according to the present invention which is capable of continuously monitoring the power distribution system for harmonic pollution

FIG. 7 shows an apparatus capable of performing the method of the present invention connected to a power distribution system. The apparatus includes the harmonic current meter 44, and the harmonic voltage meter 46. The harmonic voltage meter 46 is connected to measure the harmonic voltage $V_t$ across the power line 24 at the connection point. The harmonic current meter 44 is connected to measure the total harmonic current $I_t$ flowing through the connection point 50 (i.e. current flowing between network A and network B). Meters 44, 46 provide the voltage and current measurements to a computer 70 such as a microprocessor. Microprocessor 70 is in communication with a data storage device 72 which has stored the reference impedance values $Z_u$ and $Z_c$. In operation, the microprocessor 70 accepts voltage and current measurements from the meters 44, 46, and accepts reference impedance values from the storage device 72. The microprocessor 70 is then able to perform the calculations described in the above equations.

Preferably, the storage device of FIG. 7 has a lookup table of reference impedance values for different situations and measurements. For example, the storage device my have distinct reference impedance values for different frequencies. Also, the storage device 72 may have different reference impedance values for different configurations of electrical equipment. For example, if certain electrical equipment is only operated at certain times, then the storage device is programmed to provide different impedance values depending upon which equipment is operational at the time of measurement.

Figure 8:
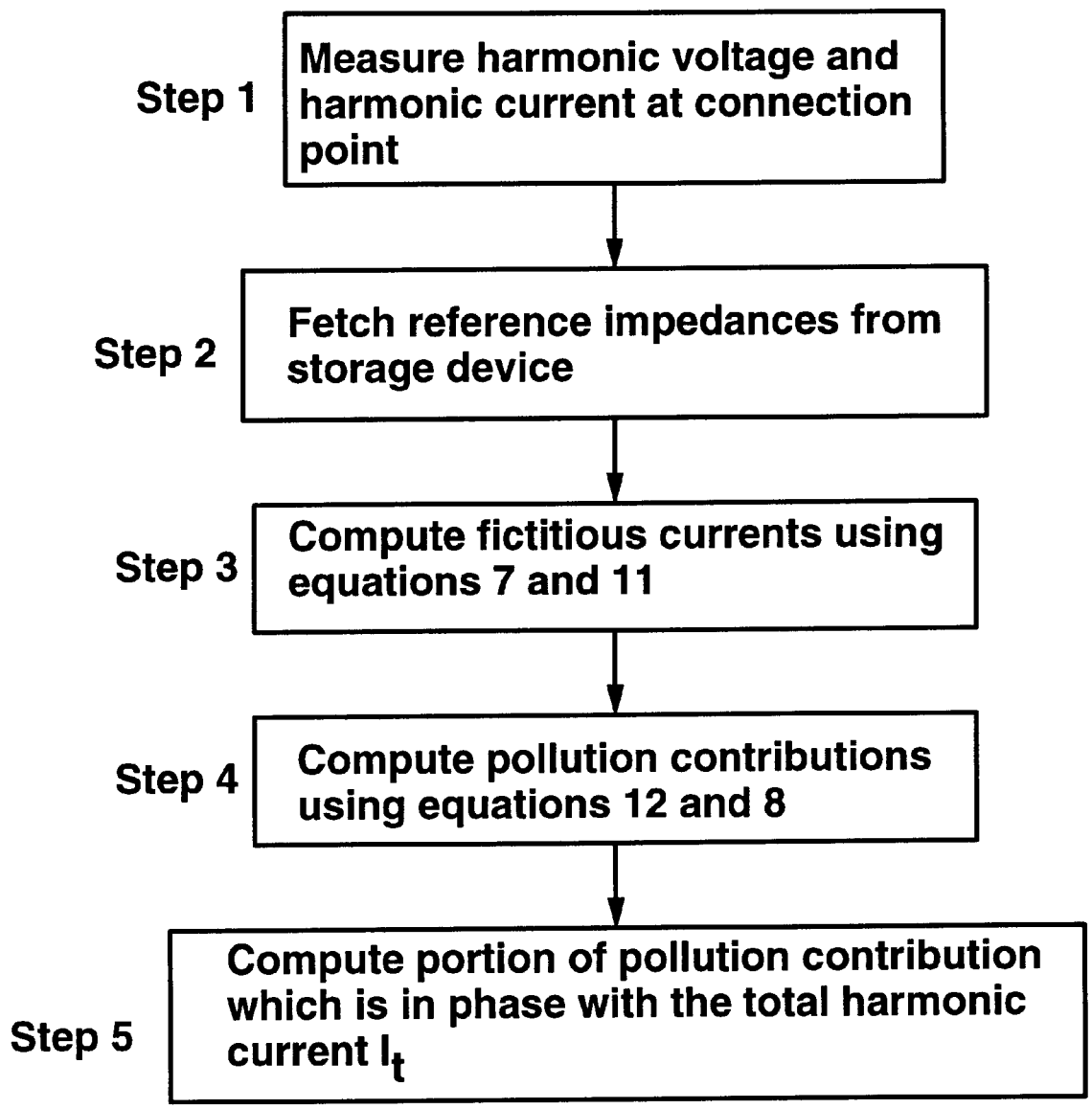
FIG. 8 shows a flow chart illustrating the method of the present invention.

The method of the present invention can be used to continuously monitor a harmonic pollution source for harmonic pollution. FIG. 8 shows a flow chart illustrating a preferred method of continuous monitoring (in the general case of single-phase power). The steps outlined in FIG. 8 can be repeated as often as desired. For example, new measurements can be performed every 5 minutes, and the results stored for harmonic pollution documentation and billing or for use by an electric utility company. In step 1, the voltage and current measurements are performed. In step 2 the reference impedances are retrieved from the storage device 72. In step 3, equations 7 and 11 are used to calculate the fictitious currents $I_u^*$ and $I_c^*$. if no change in the impedances $Z_u$ or $Z_c$ has occurred, then equations 7 and 11 will be equivalent to equations 1 and 2, respectively. The fictitious currents will be the same as the currents $I_u$ and $I_c$. In step 4, the contributions $I_{t-u}^*$ and $I_{t-c}^*$ are determined according to equations 8 and 12. Equations 8 and 12 are equivalent to equations 3 and 4 if no change in the impedances $Z_u$ or $Z_c$ has occurred. Step 5 is optional. In step 5, the in-phase portions $I_{u-in}$ and $I_{c-in}$ are determined.

It is noted that both $Z_u$ and $Z_c$ may change simultaneously in a real power distribution system. In this case, the resulting calculations for the harmonic pollution contributions are the superposition of the individual cases of $Z_u$ and $Z_c$ changes. One skilled in the art of circuit analysis will be able to perform superposition calculations based on the methods disclosed.

It is also noted that $I_u$ and $I_c$ may also change simultaneously with $Z_u$ and $Z_c$. In this case, all changes in $Z_u$ and $I_u$ are equivalenced to a new current source $I_u^*$ in parallel with reference impedance $Z_u$. All changes in $Z_c$ and $I_c$ are equivalenced to a new current source $I_c^*$ in parallel with reference impedance $Z_c$. $I_u^*$ and $I_c^*$ are determined using equations 7 and 11, respectively.

Figure 9:
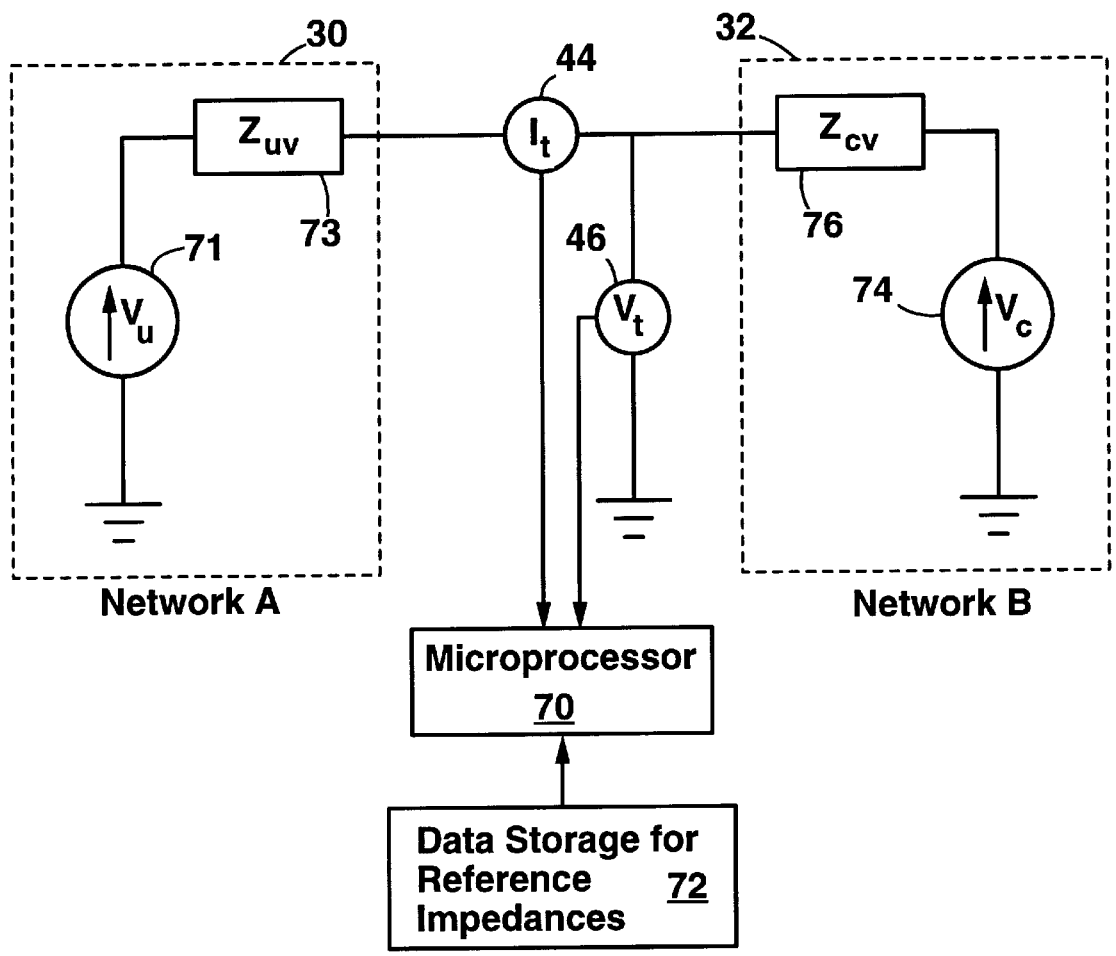
FIG. 9 shows an embodiment of the present invention which is applicable to a voltage source model of harmonic pollution sources.

It is noted that the current source model of network A and network B is preferred but somewhat arbitrary. Network A 30 and network B 32 can also each be modeled by a voltage source in series with an impedance. FIG. 9 shows a voltage source model of the power distribution system. Network A 30 is modeled to have a network A voltage source 71 which produces a voltage of $V_u$, and a network A impedance 73 in series with the voltage source 71. The impedance 73 has a value of $Z_{uv}$. Similarly, network B has a network B voltage source 74 producing a voltage of $V_c$ and a network B impedance 76 in series with the voltage source 74. The impedance 76 has a value of $Z_{cv}$.

If the voltage source model of FIG. 9 is used, the equations are different compared to the equations used for the current source model. However, the equations for the voltage source model are analogs of the current source equations.

Voltage contributions $V_{t-u}$ and $V_{t-c}$ from the utility and customer to the total voltage $V_t$ can be calculated from the following equations:

$$V_{t-u} = \frac{Z_u Z_c}{Z_u + Z_c}\left(\frac{V_t}{Z_u} + I_t\right) \qquad \text{(equation 14)}$$

$$V_{t-c} = \frac{Z_u Z_c}{Z_u + Z_c}\left(\frac{V_t}{Z_c} - I_t\right) \qquad \text{(equation 15)}$$

Further, $V_{t-u}$ can be vectorally projected onto $V_t$ to yield an in-phase component $V_{u-in}$. Also, $V_{t-c}$ can be vectorally projected onto $V_t$ to yield an in-phase component $V_{c-in}$.

If the voltage sources $V_u$ or $V_c$ change, or if the impedances $Z_{uv}$ or $Z_{cv}$ change, then changed contributions $V_{t-u}^*$ and $V_{t-c}^*$ can also be calculated from the following equations:

$$V_{t-u}^* = \frac{Z_u Z_c}{Z_u + Z_c}\left(\frac{V_t^*}{Z_u} + I_t^*\right) \quad \text{equation 16}$$

$$V_{t-c}^* = \frac{Z_u Z_c}{Z_u + Z_c}\left(\frac{V_t^*}{Z_c} - I_t^*\right) \quad \text{equation 17}$$

Changes in $V_u$, $V_c$, $Z_{cv}$, or $Z_{uv}$ are considered to be specific examples of changes in electrical characteristics. The methods of the present invention are applicable in cases where any electrical characteristic changes, internal or external to the harmonic pollution source of interest.

Therefore, the present invention can provide voltage analogs of the characteristics determined for the harmonic current model.

The present invention provides a way of converting impedance changes into changes in harmonic current, changes in harmonic voltage and changes in harmonic pollution. The changes in impedance can be internal or external to the harmonic pollution source of interest (i.e., the customer 22C). It is useful to express changes in terms of harmonic current because harmonic current is the most fundamental measure of the amount of harmonic pollution produced by a harmonic pollution source. The harmonic pollution calculation method of the present invention is particularly useful because pollution calculations directed toward a particular harmonic pollution source are not affected by impedance changes external to the pollution source. Of course, in using the method of the present invention, it is best to establish reference values of all the impedances in the power distribution system. With such reference values established, it is possible to express all subsequent pollution changes in terms of changes in harmonic current sources or harmonic voltage sources.

Also, it is useful to express all changes in terms of harmonic current or voltage because it allows an equitable measurement protocol to be established which isolates all of the harmonic pollution sources 20, 22A, 22B, 22C. When the method of present invention is used, the responsibility of each source 20, 22A, 22B, 22C for harmonic pollution is well-defined and cannot be changed by external impedance changes.

Although either harmonic current or harmonic voltage sources can be calculated using the present invention, it is preferable to determine harmonic current sources. This is because most harmonic standards limit harmonic current emission from customers. By transforming impedance changes into equivalent changes in currents, a consistent measure of current emission levels is obtained. It is not typically practical to have separate harmonic standards for both impedance values and harmonic current values.

It is noted that the present invention is usable in 2-phase or 3-phase power systems. In multi-phase power systems, the method of the present invention is performed once for each separate phase. For a 3-phase power system, for example, voltage and current measurements are each performed 3 times, and the subsequent calculations are performed 3 times. One skilled in the art will be able to implement the method of the present invention in a multi-phase power system.

The present invention is preferably incorporated into an electric power revenue meter. This is preferable because the revenue meter is located precisely at the boundary between the customer 22C and utility 20. Also, harmonic pollution measurements may be conveniently performed at the same time that electric power consumption measurements are taken.

It will be clear to one skilled in the art that the above embodiment may be altered in many ways without departing from the scope of the invention. For example, all the above equations may be approximated by substantially equivalent equations, or altered by the addition of proportionality constants for purposes of unit conversion or the like. Such mathematical variations are well known in the art and will be obvious to one skilled in the art. Accordingly, the scope of the invention should be determined by the following claims and their legal equivalents.

What is claimed is:

1. A method for determining a harmonic pollution current contribution $I_{t-x}$ from a harmonic pollution source of interest connected to a remaining portion of a power distribution system at a connection point, the method comprising the steps of:

a) measuring a total harmonic voltage $V_t$ at the connection point;

b) measuring a total harmonic current $I_t$ flowing through the connection point simultaneous with step (a);

c) calculating $I_{t-x}$ from an equation substantially equivalent to:

$$I_{t-x} = \frac{Z_x}{Z_x + Z_r}\left(\frac{V_t}{Z_x} - I_t\right)$$

where $Z_x$ is a reference impedance value of the harmonic pollution source, and $Z_r$ is a reference impedance value of the remaining portion.

2. The method of claim 1 further comprising the step of determining $I_{t-in}$, which is a component of $I_{t-x}$ that is in-phase with $I_t$.

3. A method for determining a harmonic pollution current contribution $I_{t-x}^*$ from a harmonic pollution source of interest connected to a remaining portion of a power distribution system at a connection point, wherein at least one of the remaining portion and the harmonic pollution source of interest has a changed electrical characteristic, the method comprising the steps of:

a) measuring a changed total harmonic voltage $V_t^*$ at the connection point;

b) measuring a changed total harmonic current $I_t^*$ flowing through the connection point simultaneous with step (a);

c) calculating $I_{t-x}^*$ from an equation substantially equivalent to:

$$I_{t-x}^* = \frac{Z_x}{Z_x + Z_r}\left(\frac{V_t^*}{Z_x} - I_t^*\right)$$

where $Z_x$ is the reference impedance value of the harmonic pollution source, and where $Z_r$ is a reference impedance value of the remaining portion.

4. The method of claim 3 further comprising the step of determining $I_{t-in}^*$, which is a component of $I_{t-x}^*$ that is in-phase with $I_t^*$.

5. A method for determining a harmonic pollution voltage contribution $V_{t-x}$ from a harmonic pollution source of interest connected to a remaining portion of a power distribution system at a connection point, the method comprising the steps of:

a) measuring a total harmonic voltage $V_t$ at the connection point;

b) measuring a total harmonic current $I_t$ flowing through the connection point simultaneous with step (a);

c) calculating $V_{t-x}$ from an equation substantially equivalent to:

$$V_{t-x} = \frac{Z_x Z_r}{Z_x + Z_r}\left(\frac{V_t}{Z_x} - I_t\right)$$

where $Z_x$ is a reference impedance value of the harmonic pollution source, and $Z_r$ is a reference impedance value of the remaining portion.

6. The method of claim 5 further comprising the step of determining $V_{t-in}$, which is a component of $V_{t-x}$ that is in-phase with $V_t$.

7. A method for determining a harmonic pollution voltage contribution $V_{t-x}^*$ from a harmonic pollution source of interest connected to a remaining portion of a power distribution system at a connection point, wherein at least one of the remaining portion and the harmonic pollution source of interest has a changed electrical characteristic, the method comprising the steps of:

a) measuring a changed total harmonic voltage $V_t^*$ at the connection point;

b) measuring a changed total harmonic current $I_t^*$ flowing through the connection point simultaneous with step (a);

c) calculating $V_{t-x}^*$ from an equation substantially equivalent to:

$$V_{t-x}^* = \frac{Z_x Z_r}{Z_x + Z_r}\left(\frac{V_t^*}{Z_x} - I_t^*\right)$$

where $Z_x$ is the reference impedance value of the harmonic pollution source, and where $Z_r$ is a reference impedance value of the remaining portion.

8. The method of claim 5 further comprising the step of determining $V_{t-in}^*$, which is a component of $V_{t-x}^*$ that is in-phase with $V_t^*$.

9. An apparatus for determining a harmonic pollution current contribution $I_{t-x}$ from a harmonic pollution source of interest connected to a remaining portion of a power distribution system at a connection point, the apparatus comprising:

a) a harmonic voltage meter for measuring a total harmonic voltage $V_t$ at the connection point;

b) a harmonic current meter for measuring a total harmonic current $I_t$ flowing through the connection point;

c) a data storage device for providing a reference impedance value of the harmonic pollution source and a reference impedance value of the remaining portion;

d) a computer in communication with the voltage meter, the current meter and the data storage device.

10. The apparatus of claim 9 wherein the computer includes instructions for calculating $I_{t-x}$ from an equation substantially equivalent to:

$$I_{t-x} = \frac{Z_x}{Z_x + Z_r}\left(\frac{V_t}{Z_x} - I_t\right)$$

where $Z_x$ is the reference impedance value of the harmonic pollution source, and $Z_r$ is the reference impedance value of the remaining portion.

11. An apparatus for determining a harmonic pollution voltage contribution $V_{t-x}$ from a harmonic pollution source of interest connected to a remaining portion of a power distribution system at a connection point, the apparatus comprising:

a) a harmonic voltage meter for measuring a total harmonic voltage $V_t$ at the connection point;

b) a harmonic current meter for measuring a total harmonic current $I_t$ flowing through the connection point;

c) a data storage device for providing a reference impedance value of the harmonic pollution source and a reference impedance value of the remaining portion;

d) a computer in communication with the voltage meter, the current meter and the data storage device.

12. The apparatus of claim 11 wherein the computer includes instructions for calculating $V_{t-x}$ from an equation substantially equivalent to:

$$V_{t-x} = \frac{Z_x Z_r}{Z_x + Z_r}\left(\frac{V_t}{Z_x} - I_t\right)$$

where $Z_x$ is the reference impedance value of the harmonic pollution source, and $Z_r$ is the reference impedance value of the remaining portion.

13. A method of determining a harmonic current I produced by a harmonic current source within a harmonic pollution source of interest, the harmonic pollution source being connected to a power line at a connection point, the method comprising the steps of:

a) measuring a total harmonic voltage $V_t$ at the connection point;

b) measuring a total harmonic current $I_t$ flowing through the connection point;

c) calculating I from an equation substantially equivalent to:

$$I = \frac{V_t}{Z} - I_t$$

where Z is a reference impedance value of the harmonic pollution source.

14. A method of determining a fictitious current $I^*$ produced by a harmonic current source of interest within a harmonic pollution source, the harmonic pollution source having an impedance of reference value Z which has changed to a new value of $Z^*$, the harmonic pollution source being connected to a power line at a connection point, the method comprising the steps of:

a) measuring a changed harmonic voltage $V_t^*$ at the connection point after the change in impedance from Z to $Z^*$;

b) measuring a changed total harmonic current $I_t^*$ flowing through the connection point after the change in impedance from Z to $Z^*$;

c) calculating the fictitious current $I^*$ from an equation substantially equivalent to:

$$I^* = \frac{V_t^*}{Z} - I_t^*$$

where Z is the reference impedance value of the harmonic pollution source.

* * * * *